United States Patent
Shigehara

(10) Patent No.: US 6,288,582 B1
(45) Date of Patent: Sep. 11, 2001

(54) OUTPUT CIRCUIT FOR SEMICONDUCTOR INTEGRATED CIRCUIT

(75) Inventor: Hiroshi Shigehara, Machida (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/666,982

(22) Filed: Sep. 21, 2000

(30) Foreign Application Priority Data

Sep. 22, 1999 (JP) .................................................. 11-268710

(51) Int. Cl.[7] ....................................................... H03K 3/00
(52) U.S. Cl. ............................. 327/112; 327/170; 326/83
(58) Field of Search ..................................... 327/108, 111, 327/112, 170, 310–314, 379–389, 391; 326/26, 27, 80, 83, 84, 86, 87

(56) References Cited

U.S. PATENT DOCUMENTS

| | | | |
|---|---|---|---|
| 5,576,635 | * 11/1996 | Partovi et al. | 326/27 |
| 5,933,028 | * 8/1999 | Kushiyama | 326/83 |
| 6,144,217 | * 11/2000 | Iwata et al. | 326/27 |

FOREIGN PATENT DOCUMENTS

| | | |
|---|---|---|
| 199 16 437 | 2/2000 | (DE) . |
| 2 292 856 | 3/1996 | (GB) . |
| 2000-68811 | 3/2000 | (JP) . |

OTHER PUBLICATIONS

"The I²C–Bus Specification", Version 2.0, Dec. 1998, Philips Semiconductors, p. 41, Figure 41.
Philips Semiconductors, pp. 1–23, "The I²C–Bus and How to use it (Including Specifications)", Apr. 1995.
Patent Abstracts of Japan, vol. 1998, No. 04, 1 page, Mar. 31, 1998, JP 09–311743, Dec. 2, 1997.

* cited by examiner

Primary Examiner—Toan Tran
(74) Attorney, Agent, or Firm—Oblon, Spivak, McClelland, Maier & Neustadt, P.C.

(57) ABSTRACT

An output circuit for a semiconductor integrated circuit includes an output terminal, a first NMOS transistor having one end of a current path between a drain and a source thereof connected to a first node, having a control signal input a gate thereof, and having the other end of the current path connected to a ground potential node, a second NMOS transistor having one end of a current path between a drain and a source thereof connected to the first node and the other end connected to an output terminal, a PMOS transistor and an NMOS transistor connected between a second node that is a gate of the second NMOS transistor and the output terminal, to act as capacitance elements, and a pull-up element connected between the second node and the node of the power potential.

24 Claims, 10 Drawing Sheets

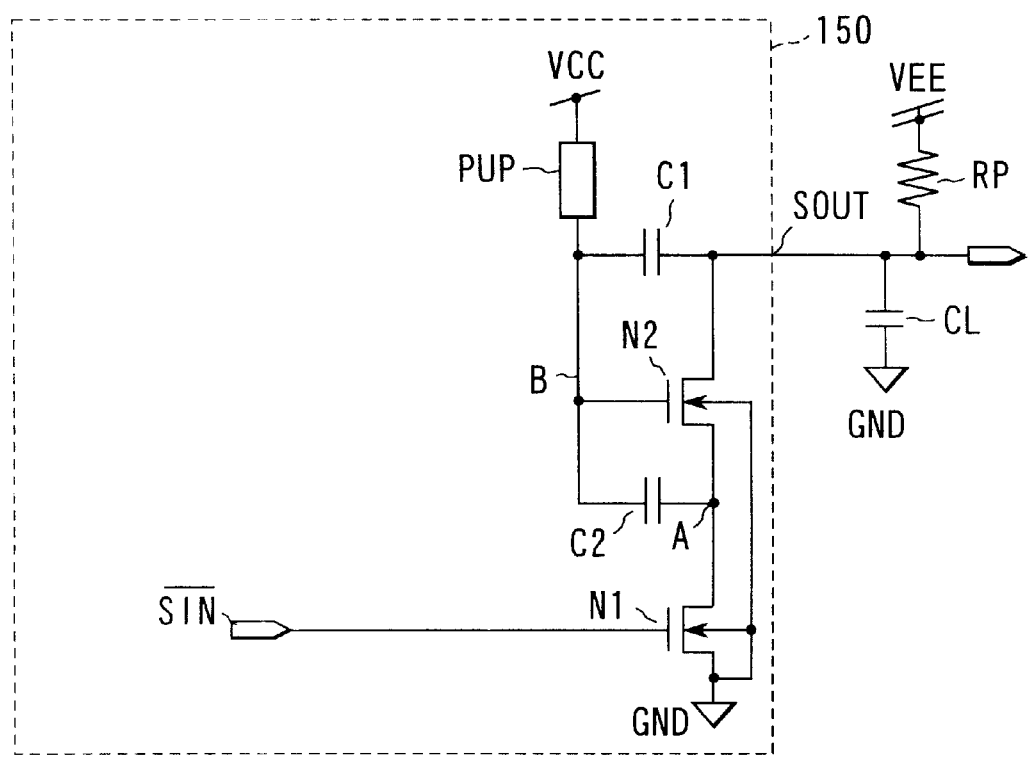
F I G. 21

OUTPUT CIRCUIT FOR SEMICONDUCTOR INTEGRATED CIRCUIT

CROSS-REFERENCE TO RELATED APPLICATIONS

This application is based upon and claims the benefit of priority from the prior Japanese Patent Application No. 11-268710, Sep. 2, 1999, the entire contents of which are incorporated herein by reference.

BACKGROUND OF THE INVENTION

The present invention relates to an output circuit for a semiconductor integrated circuit, and in particular, to an output circuit for controlling the inclination of a signal waveform (a falling or rising time) upon a rise or fall in an output signal from a CMOS circuit, the output circuit being connected, for example, to an I²C-bus external to an integrated circuit.

A circuit for controlling the inclination of a signal waveform upon a fall or rise in an output signal from an output circuit for a semiconductor integrated circuit (LSI), that is, a circuit for controlling a rising or falling time is important as a technique for restraining switching noise. An example of such a circuit is disclosed in "The I2 C-bus specifications version 2.0, December 1998", Philips Semiconductors, page 41, FIG. 41.

This document defines a FAST mode to provide a rising time between a predetermined minimum and maximum values with respect to a wide range of load capacitance values (between 10 pF and 400 pF). This document recommends this mode as a "slope controlled output stage in CMOS technology".

A circuit 200 enclosed by the broken line shown in FIG. 1 shows the configuration of a conventional output circuit recommended in the above document.

In this output circuit 200, a P-channel MOS transistor (hereafter referred to as a "PMOS transistor") P10, a resistance element R10, and an N-channel MOS transistor (hereafter referred to as an "NMOS transistor") N10 are connected in series between a power potential (VDD) node and a ground potential (GND) node to constitute an output buffer circuit. Gates of the PMOS transistor P10 and the NMOS transistor N10 are connected to an input node SIN. A node K (an output node of the output buffer circuit) having the resistance element R10 and the NMOS transistor N10 connected thereto is connected to an I/O node SIO via a capacitance element C10. An NMOS transistor N20 is connected between the I/O node SIO and the GND node, with its gate connected to the node Reference numeral RP denotes a resistance element for pulling up an external bus (I² C-bus) connected to the I/O node SIO of the LSI, to a high potential (in this example, VDD), and reference numeral CL denotes capacitive load on the I/O node SIO. The I/O node SIO also has an input circuit (not shown) in the LSI connected thereto.

FIG. 2 shows an operational waveform from the output circuit in FIG. 1.

When the input node SIN is at the potential VDD, the NMOS transistor N10 is turned on while the PMOS transistor P10 is turned off, thereby setting the node K at the GND. In addition, the NMOS transistor N20 is turned off and the I/O node SIO is pulled up to the VDD by means of the resistance element RP.

When the potential of the input node SIN changes to the GND, the NMOS transistor N10 is turned off while the PMOS transistor P10 is turned on, thereby raising the node K to the VDD. At this point, the VDD node charges the load capacitance (partly consisting of the capacitance element C10) of the node K via the resistance element R10, thereby reducing a speed at which the potential of the node K rises.

In response to the rise in the potential of the node K, the NMOS transistor N20 is turned on to lower the potential of the I/O node SIO from the VDD to the GND. In this case, in response to the fall in the potential of the I/O node SIO, the capacitance element C10 pulls the node K to the GND, thereby further diminishing the rising speed of the potential of the node K.

Consequently, a speed further decreases at which an on resistance of the NMOS transistor N20 decreases in response to the rise in the potential of the node K, thereby lowering the drop speed of the potential of the I/O node SIO. The potential of the I/O node SIO finally reaches a value obtained by a divided resistance including the on resistance of the NMOS transistor N20, to which the gate voltage that has reached the VDD is applied, and the resistance element RP (this value is hereafter referred to as a "divided voltage value").

On the contrary, when the potential of the input node SIN changes from the GND to the VDD, the PMOS transistor P10 is turned off while the NMOS transistor N10 is turned on, thereby lowering the node K to the GND. At this point, the load capacitance (partly consisting of the capacitance element C10) of the node K is discharged to reduce a speed at which the potential of the node K falls.

Then, in response to the fall in the potential of the node K, the on resistance of the NMOS transistor N20 increases to raise the potential of the I/O node SIO from the divided voltage value to the VDD. In this case, in response to the rise in the potential of the I/O node SIO, the capacitance element C10 pulls the node K to the VDD, thereby further diminishing the falling speed of the potential of the node K.

Consequently, the speed further decreases at which the on resistance of the NMOS transistor N20 decreases in response to the fall in the potential of the node K, thereby lowering the rising speed of the potential of the I/O node SIO. The potential of the I/O node SIO finally reaches the VDD.

Next, problems of the above described conventional technique will be explained.

When the potential of the input node SIN changes from the GND to the VDD, the capacitance element C10 diminishes the rising speed of the potential of the node K. Accordingly, a large amount of time is required until the NMOS transistor N20 is turned off, and a DC current flows from the external VDD to the GND through the pull-up resistance element RP and the NMOS transistor N20. This DC current is unwanted and should be eliminated.

Alternatively, if, for example, the NMOS transistor N20, which is part of the output circuit 200, is an element formed using a device technology that allows the NMOS transistor N20 to be used in a 3.3-V system (system for operation under a power voltage of 3.3 V±0.3 V) LSI and the resistance element RP pulls the potential up to 5 V, this potential of 5 V is applied between a drain and source of the NMOS transistor N20 and between a drain and gate thereof.

In addition, if the capacitance element C10 is formed using a gate oxide film in a MOS transistor that is a 3.3-V device, electric fields resulting from a potential difference of 5 V are applied to the gate oxide film.

As described above, if the NMOS transistor N20 or the capacitance element C10, which is part of the output circuit 200, is a 3.3-V device that can withstand a voltage of about 4.5 V and the resistance element RP pulls the potential up to 5 V as described above, the NMOS transistor N20 or the capacitance element C10 will be unreliable. No measures for solving such a problem are disclosed in the above described document.

As described above, the output circuit for the conventional LSI is disadvantageous in that the capacitance element connected between the output terminal of the output buffer circuit and I/O terminal may cause an unwanted DC current to flow from the pull-up resistance element of the external bus to the transistor connected to the output terminal. In addition, if the pull-up potential of the external bus is higher than the withstand voltage of the transistor connected to the output terminal, the transistor will be unreliable.

BRIEF SUMMARY OF THE INVENTION

It is thus an object of the present invention to provide an output circuit for a semiconductor integrated circuit which prevents an unwanted DC current from flowing through a transistor connected to an output terminal of an output buffer circuit, thereby avoiding deterioration of reliability associated with the withstand voltage of the transistor, and which can control a rising speed.

According to the present invention, there is provided an output circuit for a semiconductor integrated circuit comprising a signal output terminal; an N-channel first MOS transistor having a current path between a drain and a source thereof, and a gate, one end of the current path being connected to a ground potential node, and the gate being supplied with a first control signal; a first node connected to the other end of the current path of the first MOS transistor; an N-channel second MOS transistor having a current path between a drain and a source thereof, and a gate, and one end of the current path being connected to the first node and the other end of the current path being connected to the signal output terminal; a second node connected to the gate of the second MOS transistor; a capacitance element connected between the second node and the signal output terminal; a first power node to which a first power potential is supplied; and a first pull-up element connected between the second node and the first power node.

Alternatively, according to the present invention, there is provided an output circuit for a semiconductor integrated circuit comprising a signal output terminal; an N-channel first MOS transistor having a current path between a drain and a source thereof, and a gate, one end of the current path being connected to a ground potential node, and the gate being supplied with a first control signal; a first node connected to the other end of the current path of the first MOS transistor; an N-channel second MOS transistor having a current path between a drain and a source thereof, and a gate, and one end of the current path being connected to the first node and the other end of the current path being connected to the signal output terminal; a second node connected to the gate of the second MOS transistor; a capacitance element connected between the first node and the second node; a first power node to which a first power potential is supplied; and a first pull-up element connected between the second node and the first power node.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 21 is a circuit diagram showing a basic configuration of the fourteenth embodiment and its variations.

DETAILED DESCRIPTION OF THE INVENTION

Embodiments of the present invention will be described below in detail with reference to the drawings.

Figure 3:
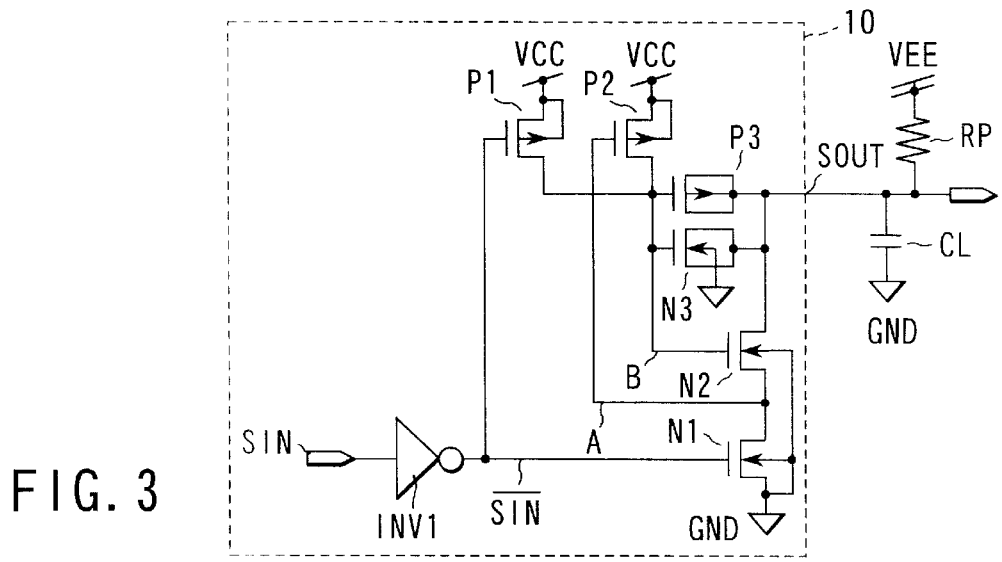
FIG. 3 is circuit diagram showing an output circuit for an LSI according to a first embodiment of the present invention.

FIG. 3 shows the configuration of an output circuit for an LSI according to a first embodiment of the present invention.

In this output circuit 10, reference VCC denotes a power potential of the LSI and reference GND denotes a ground potential. An input node SIN having an internal signal input thereto has an input node of an inverter circuit INV1 connected thereto. A signal output from an output node /SIN of the inverter circuit INV1 is input to each of gates of a PMOS transistor P1 and an NMOS transistor N1.

The PMOS transistor P1 has its source and back gate both connected to a VCC node, while the NMOS transistor N1 has its back gate and source both connected to a GND node. A gate and source of an NMOS transistor N2 are connected between a drain of the PMOS transistor P1 and a drain of the NMOS transistor N1.

Further, a PMOS transistor P2 is provided as a pull-up element. The PMOS transistor P2 has a gate connected to a first node A connected in series between the NMOS transistors N2 and N1, a source and a back gate both connected to the VCC node, and a drain connected to the gate (second node B) of the NMOS transistor N2.

The NMOS transistor N2 has a drain connected to an output node (an output terminal) SOUT, and a capacitance element is connected between the drain of the NMOS transistor N2 and node B. In this example, this capacitance element comprises a first and second capacitance elements connected in parallel.

The first capacitance element comprises a PMOS transistor P3 having a source, a drain, and a back gate all connected to the output node SOUT. The transistor P3 has a gate connected to the second node B to use a capacitance generated between the gate and a channel that sandwich a gate oxide film therein.

In addition, the second capacitance element comprises an NMOS transistor N3 having a drain and a source both connected to the output node SOUT, a gate connected to the second node B, and a back gate connected to the GND node. The second capacitance element uses a capacitance generated between the gate and a channel that sandwich a gate oxide film in the transistor N3.

Reference RP denotes a pull-up resistance element for an external bus ($I^2$C-bus) connected to the output node SOUT, the resistance element having one end connected to a node of a pull-up power potential VEE. Reference CL denotes a capacitive load on the output terminal SOUT.

The output circuit 10 comprises, for example, a 3.3-V device (transistor), wherein VCC=3.3 V±0.3 V, VEE=5.0 V±0.5 V, and VCC<VEE.

Figure 4:
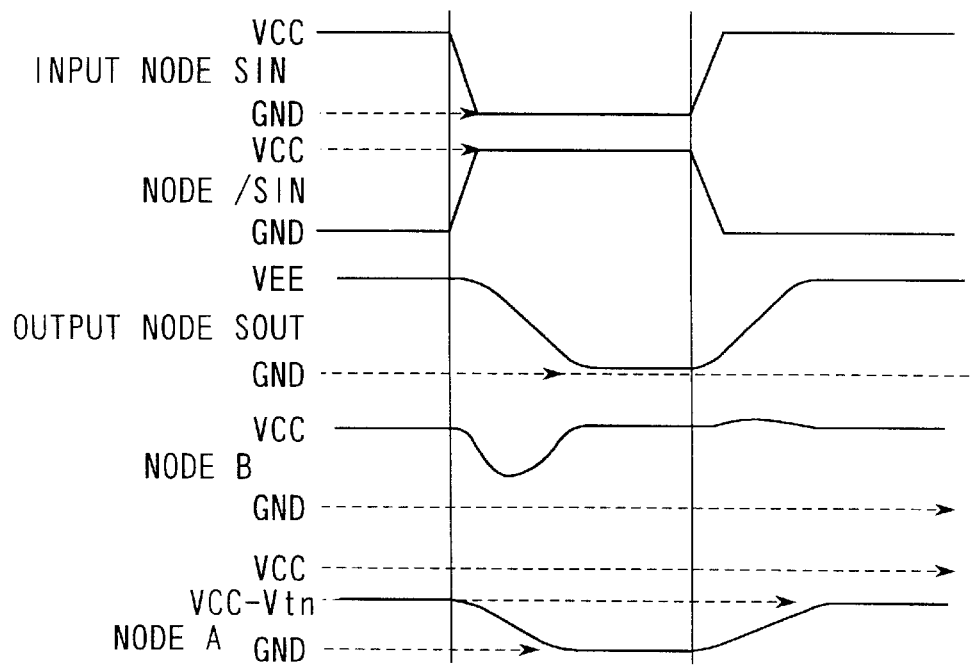
FIG. 4 is a waveform diagram showing an operational waveform from the output circuit in FIG. 3.

Next, the operation of the output circuit configured as shown in FIG. 3 will be described with reference to the waveform diagram in FIG. 4. when an input node SIN is a t the potential VCC, an output node /SIN of an inverter INV1 is at the potential GND. Accordingly, the NMOS transistor N1 is turned off while the PMOS transistor P1 is turned on, thereby setting the node B to the potential VCC. Additionally, since the NMOS transistor N1 is off, the output node SOUT has its potential pulled up to VEE by means of a resistance element RP.

In this case, even though the output node SOUT is at the potential VEE (=5.0 V±0.5 V), no problem occurs with the withstand voltage because the NMOS transistor N2 has a gate potential equal to the VCC (=3.3 V±0.3 V).

On the other hand, at this point, the NMOS transistor N1 has a gate potential equal to the GND, but no problem occurs with the withstand voltage because the node A is at a potential VCC-Vtn (Vtn is a threshold voltage for the transistor N2).

Furthermore, the NMOS transistor N3 and the PMOS transistor P3 each have one end set at the VCC (=3.3 V±0.3 V) and electric fields applied to the gate oxide film are low enough for 3.3-V devices, so that no problem occurs with the withstand voltages of the transistors N3 and P3.

Then, when the potential of the input node SIN changes from the VCC to the GND while the potential of the output node /SIN of the inverter circuit INV1 changes from the GND to the VCC, the MOS transistor N1 is turned on while the PMOS transistor P1 is turned off. Since the node B is initially at the VCC, the NMOS transistor N2 is on, and the potential of the output node SOUT falls from the VEE to the GND.

On the other hand, since the PMOS transistor P3 has a gate connected to the node B and nodes including a drain, a source, and a sub-straight connected to the output node SOUT and VCC<VEE, a channel is created immediately below the gate and the PMOS transistor P3 strongly couples the node B and the output node SOUT as a capacitor. In addition, since the NMOS transistor N3 has a gate connected to the node B and having a lower potential than a drain source node, no channel is created immediately below the gate and the NMOS transistor N3 weakly couples the node B and the output node SOUT as a capacitor.

As described above, the capacitor formed by the PMOS transistor P3 lowers the potential of the node B from the VCC down to the GND in response to a fall in the potential of the output node SOUT. The degree of this pull-down can be arbitrarily set by adjusting a driving force of the PMOS transistor P2 (adjusting a channel length or width), which pulls the node B up to the potential VCC.

Once the potential of the node B has been pulled down, conductivity of the NMOS transistor N2 lowers to raise its on resistance. Accordingly, a speed at which the potential of the output node SOUT falls decreases. When the potential of the output node SOUT falls below the VCC, an inverted channel is formed in the NMOS transistor N3, whereas an inverted channel in the PMOS transistor P3 disappears. Then, the node B and the output node SOUT are principally coupled together by the capacitor formed by the NMOS transistor N3. This capacitor also pulls the node B down to the GND in response to the fall in the potential of the output node SOUT, thereby reducing the conductivity of the NMOS transistor N2 to raise its on resistance.

Consequently, the falling speed of the potential of the output node SOUT decreases. Although the node B is temporarily pulled down to the VCC or lower by means of the above described capacitor, the PMOS transistor P2 finally pulls the node B up to the VCC to stabilize it at this potential. Thus, the potential of the output node SOUT finally reaches a value obtained by means of a divided resistance including the synthetic on resistance of the NMOS transistors N1 and N2 connected in series, to which the gate voltage that has reached the VDD is applied, and the resistance element RP. Under these conditions, no problem occurs with the withstand voltages of the NMOS transistors N1 and N2.

Figure 1:
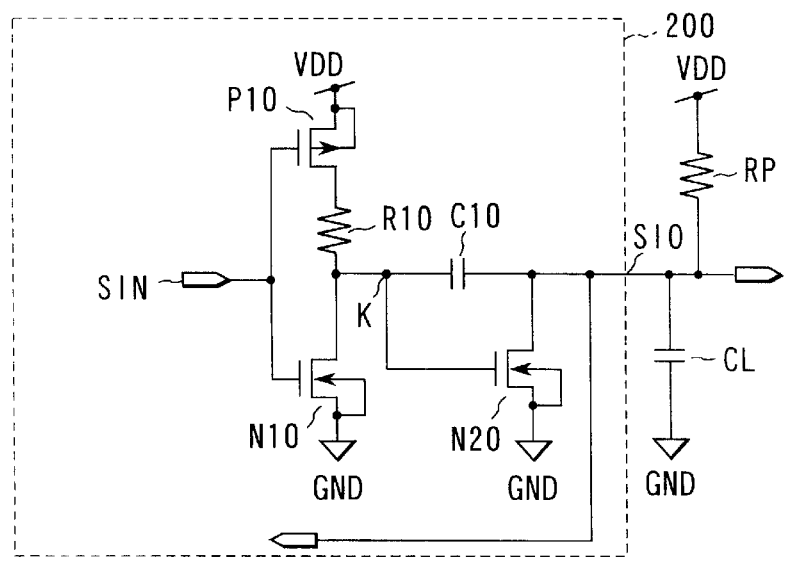
FIG. 1 is s circuit diagram showing an output circuit for a conventional LSI.
Figure 2:
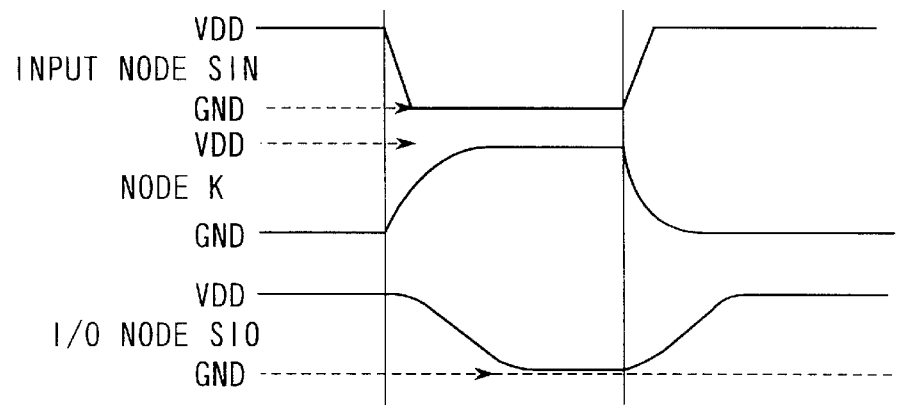
FIG. 2 is a waveform diagram showing an operational waveform from the output circuit in FIG. 1.

On the contrary, when the potential of the input node SIN changes from the GND to the VCC while the potential of the output node /SIN of the inverter circuit INV1 changes from the VCC to the GND, the NMOS transistor N1 is turned off while the PMOS transistor PI is turned on. At this point, both the PMOS transistors P2 and P1 are turned on, so that the node B is intensively pulled up to the VCC. Since the NMOS transistor N1 is immediately turned off, no unwanted DC current flows as in the conventional output circuit described above with reference to FIG. 1, and the potential of the output node SOUT is pulled up to the VEE only by the resistance element RP. At this point, the PMOS transistor P3 and the NMOS transistor N3 act as the capacitor between the node B and the output node SOUT based on the above described mechanism, so that the node B is pulled up to a potential higher than the VCC in response to a rise in the potential of the output node SOUT. However, by adjusting the channel length or width of the PMOS transistor P1 to regulate its driving force, the amount of pull-up for the potential of the node B can be sufficiently reduced. The reason why the amount of pull-up must be sufficiently reduced is shown below.

When the potential of the node B is pulled up, the potential of the node A may increase above VCC-Vtn because the potential of the node B is input to the NMOS transistor N2 as its gate potential. If the amount of pull-up for the potential of the node B is large, a potential higher than the withstand voltage of the NMOS transistor N1 may appear at the node A. On the other hand, since the NMOS transistor N1 is off, no force is exerted to pull down the potential of the node A. Thus, it is important to diminish the amount of pull-up for the potential of the node B.

That is, according to the output circuit 10 in the above described first embodiment, the current paths of the NMOS transistors N2 and N1 are connected in series between the output node SOUT and the GND node, and the gate voltages of these transistors are appropriately controlled. This precludes an unwanted DC current from flowing through the NMOS transistor N2 connected to the output node SOUT or through the NMOS transistor N1 connected to the NMOS transistor N2, thereby avoiding deterioration of reliability associated with the withstand voltages of the NMOS transistors N2 and N1. At the same time, the rising speed can be controlled.

In the output circuit 10 according to the first embodiment, a voltage applied to the output node SOUT is defined as Vout, and an allowable maximum value of the Vout is smaller than a minimum value of the withstand voltage of the NMOS transistor N2 connected to the output node SOUT. When a gate withstand voltage (a withstand voltage between a gate and a drain/source) of the NMOS transistor N2 is represented by VGB, a withstand voltage between the drain and source of the NMOS transistor N2 is represented by VDSB, and a pn junction breakdown voltage between a drain diffusion and P-type back gate of the NMOS transistor N2 is represented by VJB, and the allowable maximum value of the Vout is the smallest of (VCC+VGB), (VCC−Vtn2+VDSB), and the VJB. Reference Vtn2 denotes a threshold voltage of the NMOS transistor N2.

Typically, (VCC+VGB) and (VCC−Vtn2+VDSB) are each smaller than the VJB, and the allowable maximum value of the Vout is thus the smaller of (VCC+VGB) and (VCC−Vtn2+VDSB).

In contrast, in the conventional output circuit 200 described above with reference to FIG. 1, when a gate voltage of the NMOS transistor N20 is represented by VGB', a drain-source voltage of the NMOS transistor N20 is represented by VDB, and a pn junction breakdown voltage between a drain diffusion and P-type back gate of the NMOS transistor N20 is represented by VJB', an allowable maximum value of the Vout is a minimum value of the VGB', the VDB, or the VJB', and the VGB' or the VDB is smaller than (VCC+VGB) and (VCC−Vtn2+VDSB).

In the above described first embodiment, the potential of the output node SOUT is set based on a signal from the single input node SIN, but the circuit may be changed to perform logical operations for a plurality of input signals SINj (j=1, 2, 3, 4, . . . ). Since the output node SOUT is set to "H" by means of the pull-up element RP, the configuration of the circuit may be changed to set the output node SOUT to "L". The basic concept, however, is as shown below.

When any logic to be implemented by the plurality of input signals SINj (j=1, 2, 3, 4, . . . ) is constructed using a circuit of a CMOS structure, the NMOS transistor N1 is replaced with a section of this circuit which is constructed of NMOS transistors. Simultaneously, the PMOS transistor is replaced with a section of this circuit which is constructed of PMOS transistors.

Figure 5:
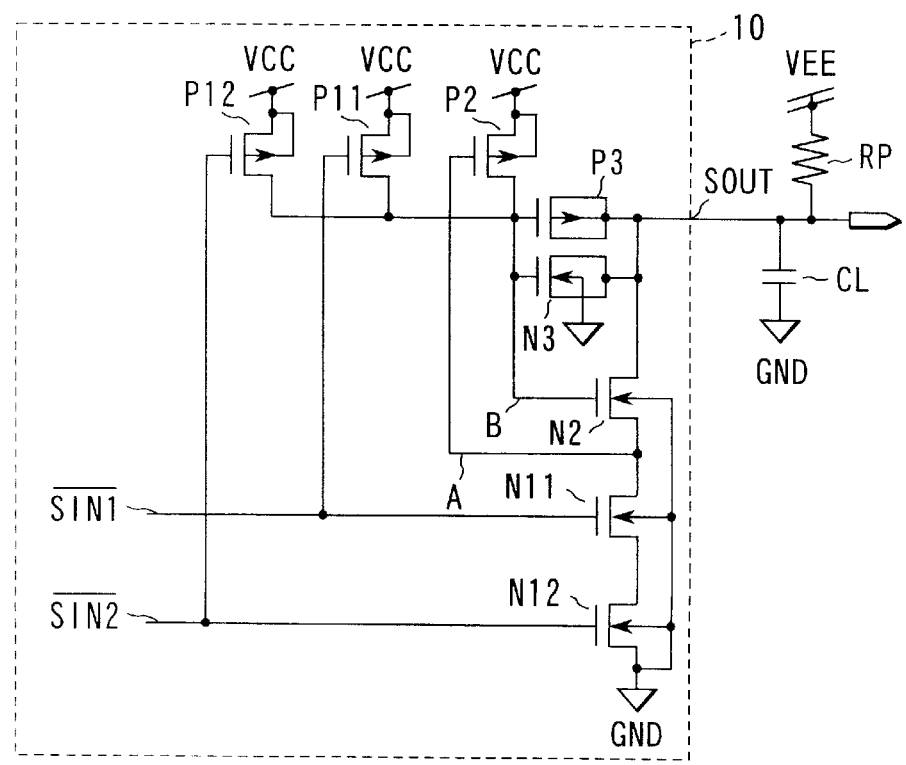
FIG. 5 is circuit diagram showing an output circuit for an LSI according to a second embodiment of the present invention.
Figure 6:
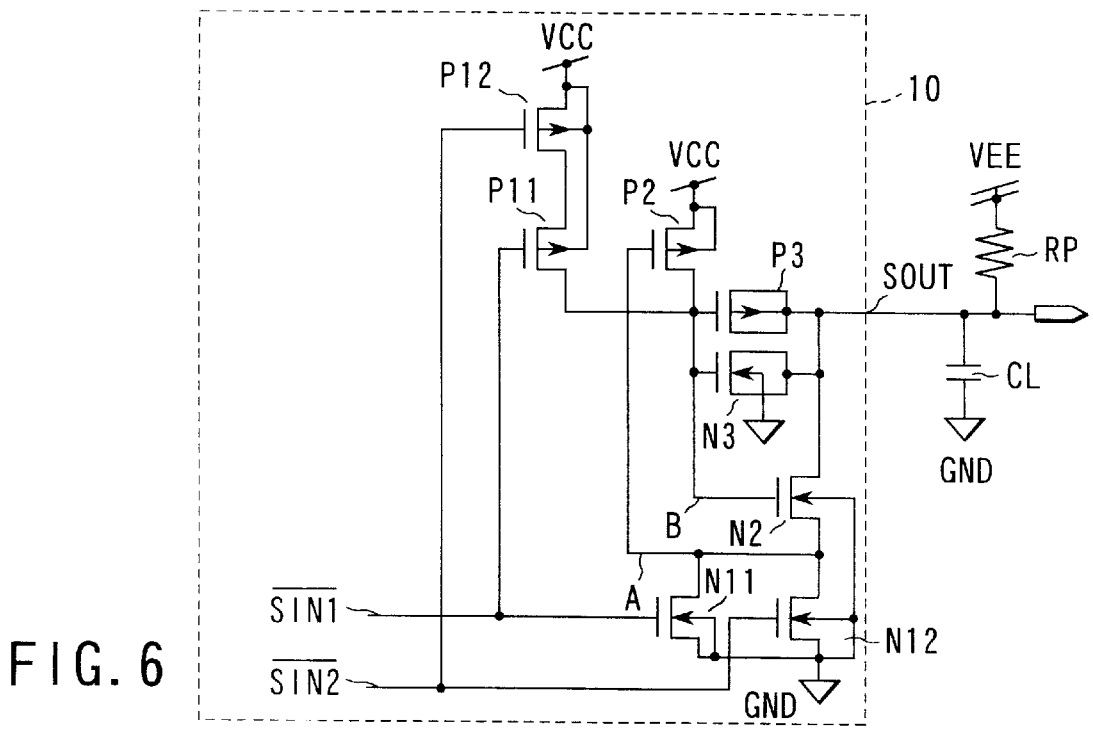
FIG. 6 is circuit diagram showing an output circuit for an LSI according to a third embodiment of the present invention.

When, for example, a NAND operation for signals from two input nodes /SIN1 and /SIN2 (when /SIN1="H" and /SIN2="H", a signal from the output node SOUT becomes "L", and otherwise the pull-up element RP sets a signal from the output node SOUT to "H") is implemented, the NMOS transistor N1 may be replaced with a circuit including an NMOS transistor N11 having a gate to which a signal supplied to the input node /SIN1 is input and an NMOS transistor N12 having a gate to which a signal supplied to the input node /SIN2 is input, the NMOS transistors N11 and N12 are connected in series, as shown by an output circuit according to a second embodiment, shown in FIG. 5. The PMOS transistor P1 may be replaced with a circuit including a PMOS transistor P11 having a gate to which a signal supplied to the input node /SIN1 is input and a PMOS transistor P12 having a gate to which a signal supplied to the input node /SIN2 is input, the PMOS transistors P11 and P12 are connected in parallel. When, for example, a NOR operation for signals from two input nodes /SIN1 and /SIN2 (when /SIN1="H" or /SIN2="H", a signal from the output node SOUT becomes "L", and otherwise the pull-up element RP sets a signal from the output node SOUT to "H") is implemented, the NMOS transistor N1 may be replaced with a circuit including the NMOS transistor N11 having a gate to which a signal supplied to the input node /SIN1 is input and the NMOS transistor N12 having a gate to which a signal supplied to the input node /SIN2 is input, the NMOS transistors N11 and N12 are connected in parallel, as shown by an output circuit according to a third embodiment, shown in FIG. 6. The PMOS transistor P1 may be replaced with a circuit comprising the PMOS transistor P11 having a gate to which a signal supplied to the input node /SIN1 is input and the PMOS transistor P12 having a gate to which a signal supplied to the input node /SIN2 is input, the PMOS transistors P11 and P12 are connected in series.

Figure 7:
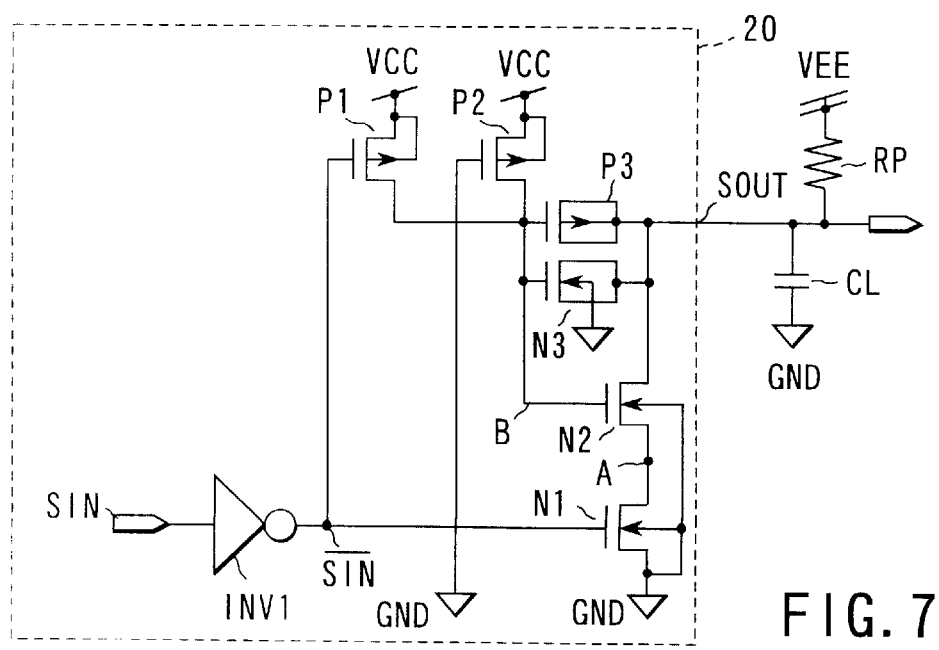
FIG. 7 is circuit diagram showing an output circuit for an LSI according to a fourth embodiment of the present invention.

FIG. 7 shows an output circuit for an LSI according to a fourth embodiment of the present invention.

This output circuit 20 is the same as the output circuit 10 described above with reference to FIG. 3 except that the gate of the PMOS transistor P2 is connected to the GND node. Accordingly, the components of the output circuit 20 are denoted by the same reference numerals as in FIG. 3.

The operation of the output circuit 20 in FIG. 7 is essentially similar to that of the output circuit 10 in FIG. 3 described above with reference to FIG. 4 except for the following points. The potential of the node A is always higher than the GND. Consequently, if the on resistance of the PMOS transistor P2 is set at a desired value, the PMOS transistor P2 having its gate connected to the node A as in the output circuit 10 in FIG. 3 may advantageously be geometrically smaller than the PMOS transistor P2 having its gate connected to the GND node as in the output circuit 20 in FIG. 7. For example, the former transistor may have a smaller channel length than the latter if both have the same channel width.

On the other hand, the PMOS transistor P2 having its gate connected to the GND node as in the output circuit 20 in FIG. 7 is advantageous in that the driving force of the PMOS transistor P2 can be designed easily because the gate voltage is constant regardless of the output potential.

Figure 8:
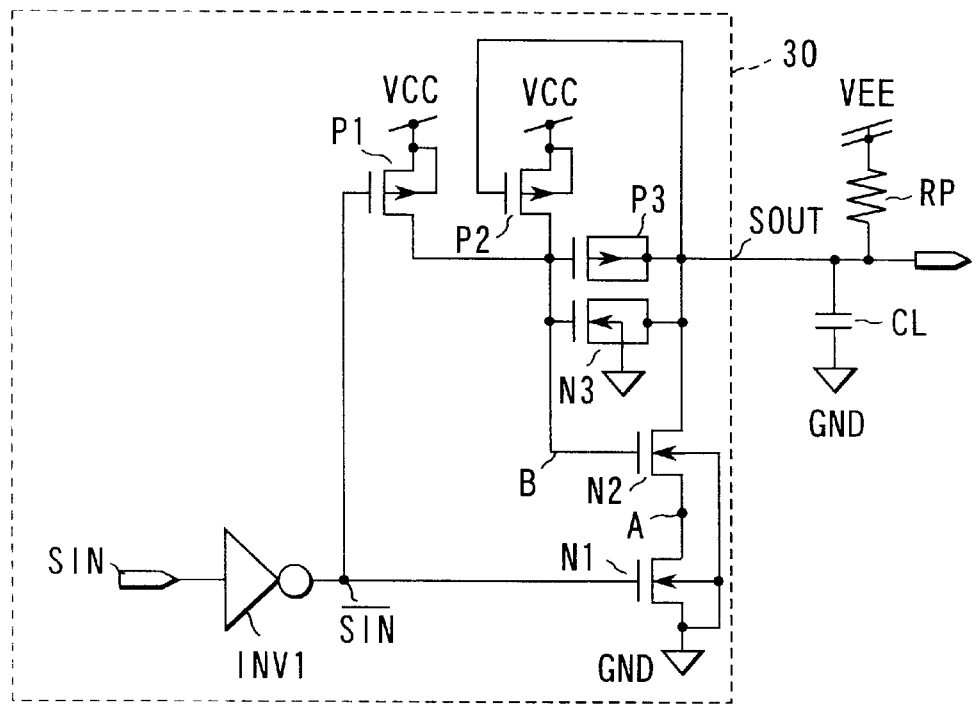
FIG. 8 is circuit diagram showing an output circuit for an LSI according to a fifth embodiment of the present invention.

FIG. 8 shows an output circuit for an LSI according to a fifth embodiment of the present invention.

The output circuit 30 is the same as the output circuit 10 described above with reference to FIG. 3 except that the gate of the PMOS transistor P2 is connected to the output node SOUT.

The operation of the output circuit 30 in FIG. 8 is essentially similar to that of the above described output circuit 10 in FIG. 3 except for the following points. While the potential of the output node SOUT is such that VCC−|Vtp|<SOUT≦VEE (Vtp: a threshold voltage of the PMOS transistor P2), the PMOS transistor P2 is cut off. On the other hand, immediately before the potential of the output node SOUT rises, the PMOS transistor P1 is on and the potential of the node B is at the VCC. Thus, when the PMOS transistor P2 is turned off, the node B remains at the VCC.

In response to the rise in the potential of the output node SOUT, the capacitance element (the PMOS transistor P3 and the NMOS transistor N3) pulls the node B down to the VCC or lower, thereby reducing the driving force of the NMOS transistor N2 to make a rising waveform of the potential of the output node SOUT gentle. When the potential of the output node SOUT is ≦VCC−|Vtp|, the PMOS transistor P2 is turned on to gradually pull the node B up to the VCC.

Thus, the operation of the output circuit 30 in FIG. 8 causes the capacitance element to pull down the node B more significantly than the operation of the output circuit 10 in FIG. 3 or the operation of the output circuit 20 in FIG. 7. Consequently, if the on resistance of the PMOS transistor P2 is set at a desired value, the PMOS transistor P2 in the output circuit 30 in FIG. 8 may advantageously be geometrically smaller than the PMOS transistors P2 in the output circuit 10 in FIG. 3 and in the output circuit 20 in FIG. 7. For example, the former transistor may have a smaller channel length than the latter if all of them have the same channel width.

In the output circuit in each of the above described embodiments, the PMOS transistor P2 serves to pull the node B up to the VCC. Thus, the PMOS transistor P2 may be replaced with another element acting equivalently.

Figure 9:
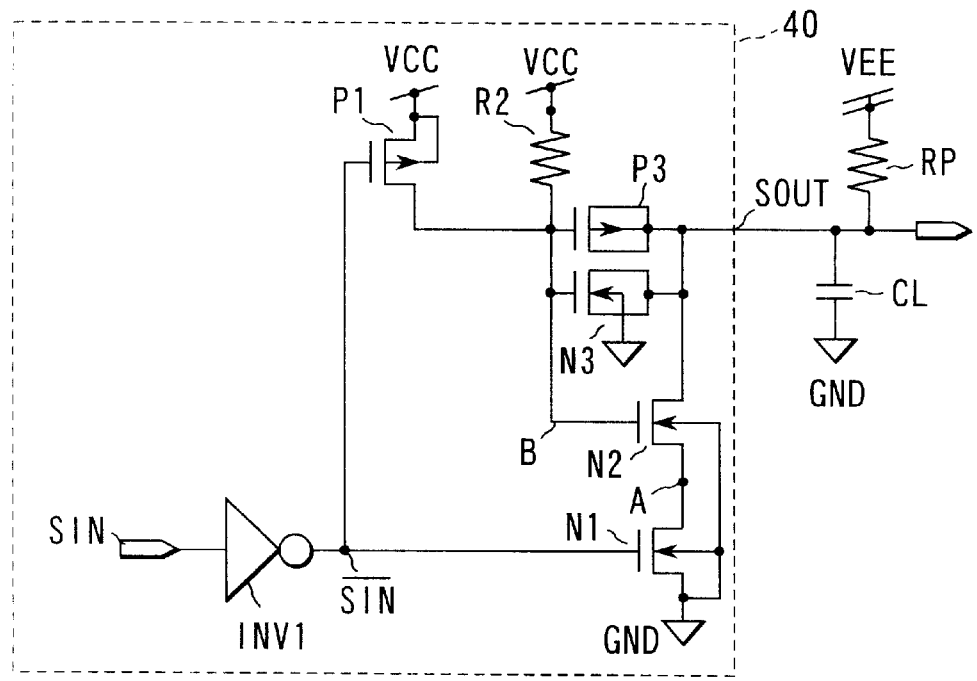
FIG. 9 is circuit diagram showing an output circuit for an LSI according to a sixth embodiment of the present invention.

FIG. 9 shows an output circuit for an LSI according to a sixth embodiment of the present invention.

This output circuit 40 is the same as the output circuit 10 described above with reference to FIG. 3 except that the pull-up PMOS transistor P2 is replaced with a resistance element R2. Accordingly, the components of the output circuit 40 are denoted by the same reference numerals as in FIG. 3.

In the output circuit in each of the above described embodiments, the PMOS transistor P1 serves to set the amount that the node B is pulled up to the VCC or higher in response to a rise in the potential of the output node SOUT, at a value within a predetermined range. Thus, the PMOS transistor P1 may be replaced with another element acting equivalently.

Figure 10:
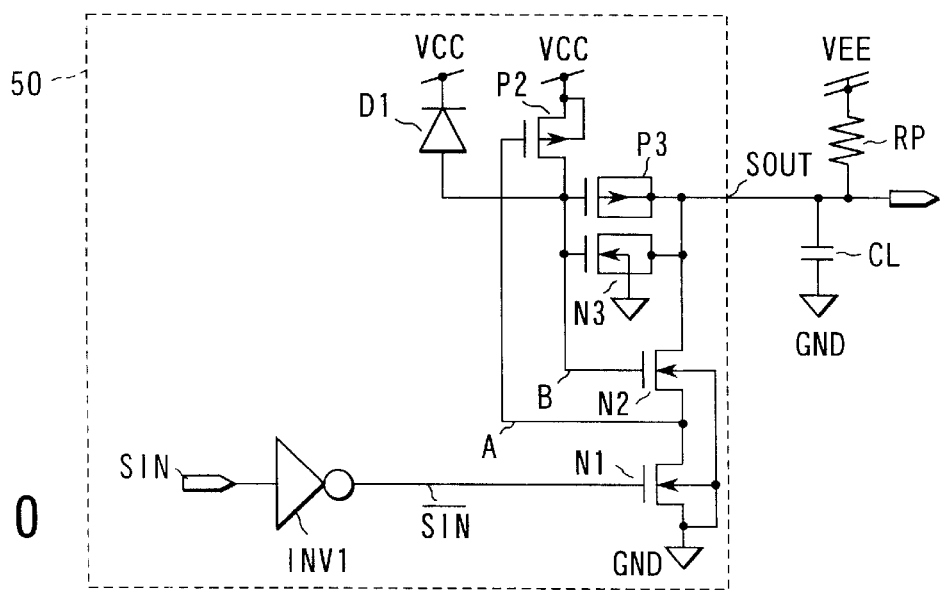
FIG. 10 is circuit diagram showing an output circuit for an LSI according to a seventh embodiment of the present invention.

FIG. 10 shows an output circuit for an LSI according to a seventh embodiment of the present invention.

This output circuit 50 is the same as the output circuit 10 described above with reference to FIG. 3 except that the PMOS transistor P1 is replaced with a pn junction diode D1 having an anode connected to the node B and a cathode connected to the node of the power potential VCC. Accordingly, the components of the output circuit 50 are denoted by the same reference numerals as in FIG. 3.

The operation of the output circuit 50 in FIG. 10 is essentially similar to that of the above described output circuit 10 in FIG. 3 but can prevent the potential of the node B from increasing to VCC+Vf (Vf: a built-in potential of the diode D1) or higher.

In the second to sixth embodiments, the pn junction diode D1 may be used instead of the PMOS transistor P1 as in the seventh embodiment.

Figure 11:
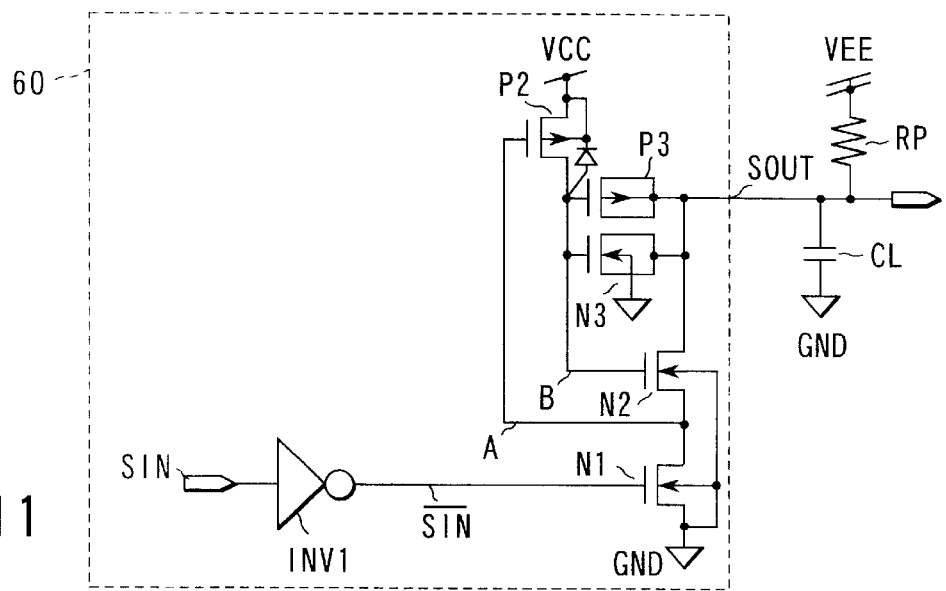
FIG. 11 is circuit diagram showing an output circuit for an LSI according to an eighth embodiment of the present invention.

Further, in the second to fifth embodiments each having the PMOS transistor P2, a parasitic pn junction diode occurring between the node B and back gate of the PMOS transistor P2 serves in the same manner as the pn junction diode D1. This configuration may be utilized to remove the PMOS transistor P1 or the pn junction diode D1 as shown in an output circuit 60 in FIG. 11 according to an eighth embodiment of the present invention.

Figure 12:
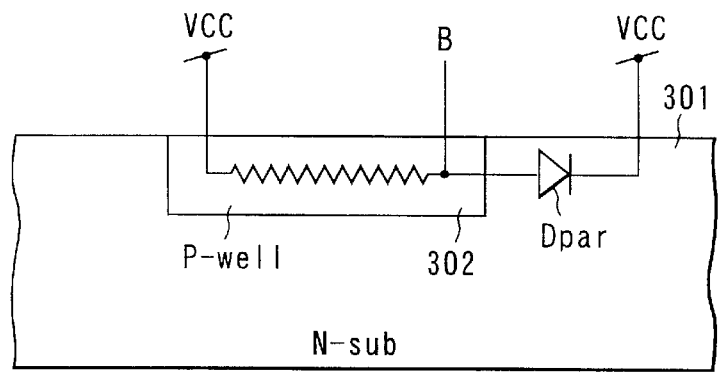
FIG. 12 is a sectional view showing the structure of a resistance element used in the circuit in FIG. 9.

In the sixth embodiment, if the resistance element R2 is constructed using a p-type diffusion layer (P-well) 302 on an N-type semiconductor substrate (N-sub) 301 which has been biased to the VCC as shown in FIG. 12, a parasitic pn junction diode Dpar between the node B and the N-type semiconductor substrate 301 serves in the same manner as the pn junction diode D1. Thus, if the resistance element R2 having a sectional structure such as that shown in FIG. 12, the parasitic pn junction diode Dpar may be utilized to remove the PMOS transistor P1 or the pn junction diode D1.

Further, in each of the above described embodiments, (1) Both the PMOS transistor P3 and NMOS transistor N3 used as capacitance elements need not be provided but the embodiment may be varied to have only one of them. Since, however, the effects of the PMOS transistor P3 and the NMOS transistor N3 as the capacitors vary depending on the relationship between the potential of the output node SOUT and the potential of the node B as described above, higher effects are of course obtained when both are connected in parallel. If VCC=VEE, only the NMOS transistor N3 can be sufficiently used as the capacitor.

(2) The capacitance of a structure having two layers of polysilicon films sandwiching an insulating film therebetween, a capacitance comprising a pn junction, or the capacitance of a structure having two metal layers sandwiching an insulating film therebetween may be employed instead of the PMOS transistor P3 and NMOS transistor N3 used as the capacitance elements. Alternatively, the capacitor connected between the output node SOUT and the node B may be a chip on the device or may be located outside the chip.

(3) A circuit including an enable control signal EN for forcibly setting the logical level of the signal from the node /SIN to the GND irrespective of the signal from the input node SIN may be used instead of the inverter INV1 in each of the first to eighth embodiments.

Figure 13:
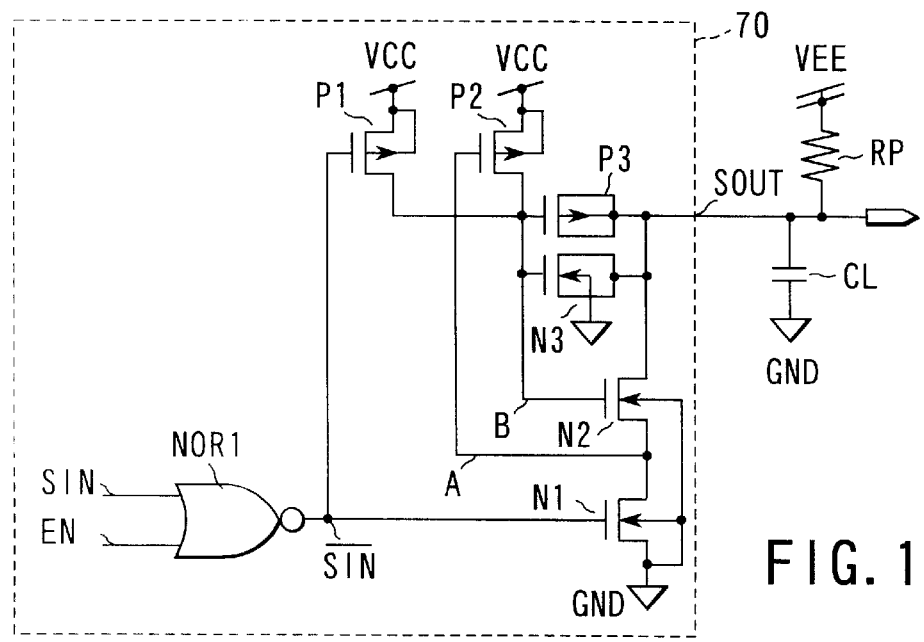
FIG. 13 is circuit diagram showing an output circuit for an LSI according to a ninth embodiment of the present invention.

An output circuit 70 according to a ninth embodiment of the present invention, shown in FIG. 13, uses a NOR circuit NOR 1 to which the signal from the input node SIN and a control signal from a control signal input node EN are input, instead of, for example, the inverter INV1 in the output circuit 10 according to the above described first embodiment. Alternatively, in the output circuits in the embodiments other than the first one, that is, the second to eighth embodiments, the NOR circuit NOR1 may be provided instead of the inverter INV1. Furthermore, the circuit may be configured to comprise a plurality of input and control signals.

The above described embodiments and their variations each has only the functions of the output circuit, but the present invention is applicable to an I/O circuit having both the functions of an input circuit and of an output circuit. An example will be described below.

Figure 14:
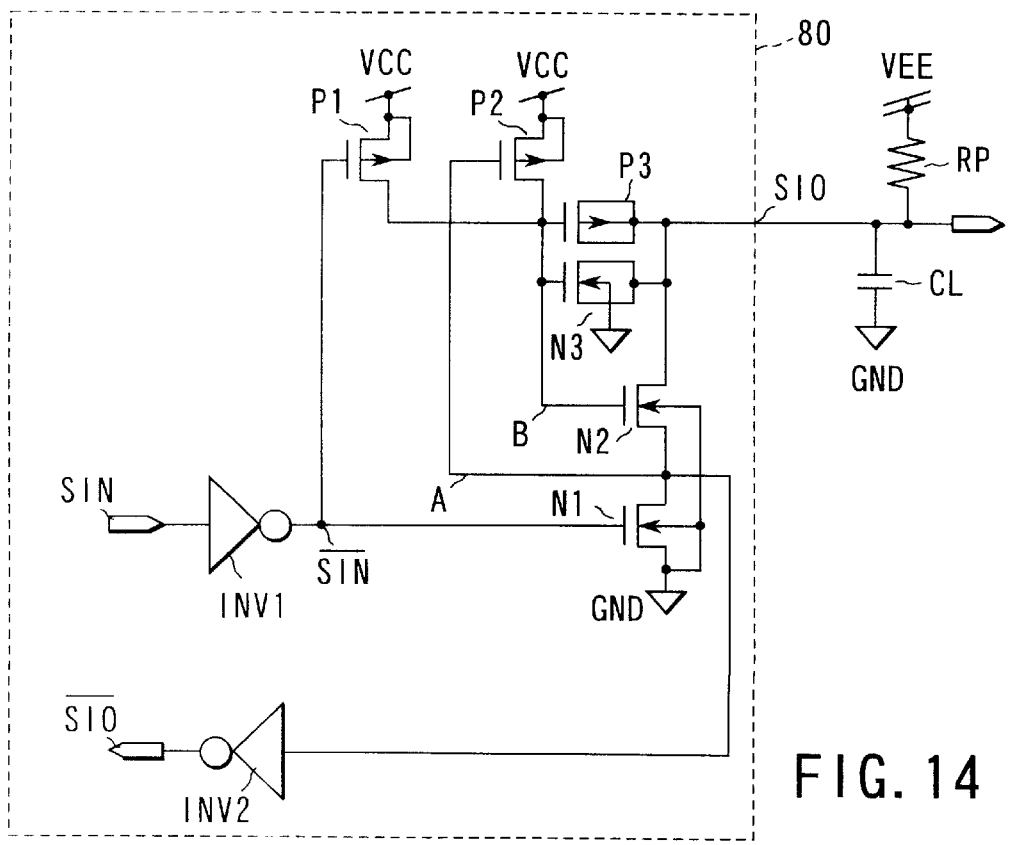
FIG. 14 is circuit diagram showing an output circuit for an LSI according to a tenth embodiment of the present invention.

FIG. 14 shows an output circuit in an LSI according to a tenth embodiment of the present invention.

This I/O circuit 80 is the same as the output circuit described above with reference to FIG. 3 except that the output node SOUT has been changed to an I/O node SIO and that an input node of an inverter INV2 for an input circuit is connected to the node A. Accordingly, the components of the I/O circuit 80 are denoted by the same reference numerals as in FIG. 3.

In the I/O circuit 80 in FIG. 14, the operation of an output circuit section is essentially similar to that of the above described output circuit 10 in FIG. 3. The operation of the input circuit section is such that a signal potential at the node A is input to the inverter INV2 and that an output signal from the inverter INV2 is supplied to an internal circuit (not shown). In this case, the operation of the NMOS transistor N2 as a clamp circuit is used to prevent the power potential VEE from being applied to a gate of an NMOS transistor (not shown) constituting the inverter INV2.

In this manner, the signal level of the node A is clamped by the NMOS transistor N2, so that an input circuit receiving a signal from the node A is not limited to the above described inverter INV2.

Alternatively, if the power potential VEE for pulling up an external bus is set at such a value as poses no problem with the withstand voltages of elements in the I/O circuit, then the I/O node SIO may of course be connected to the input node of the input circuit.

In the second to ninth embodiments and their variations, by adding an input circuit, for example, the inverter INV2 as in the tenth embodiment, the output circuit can be changed to an I/O circuit, as in the LSI according to the tenth embodiment.

In the first to tenth embodiments and their variations, the resistance element RP is used for each of the pull-up elements connected to the output node SOUT or the I/O node SIO. The present invention, however, is not limited to this but other elements can be used. Examples are shown in FIGS. 15 and 16.

Figure 15:
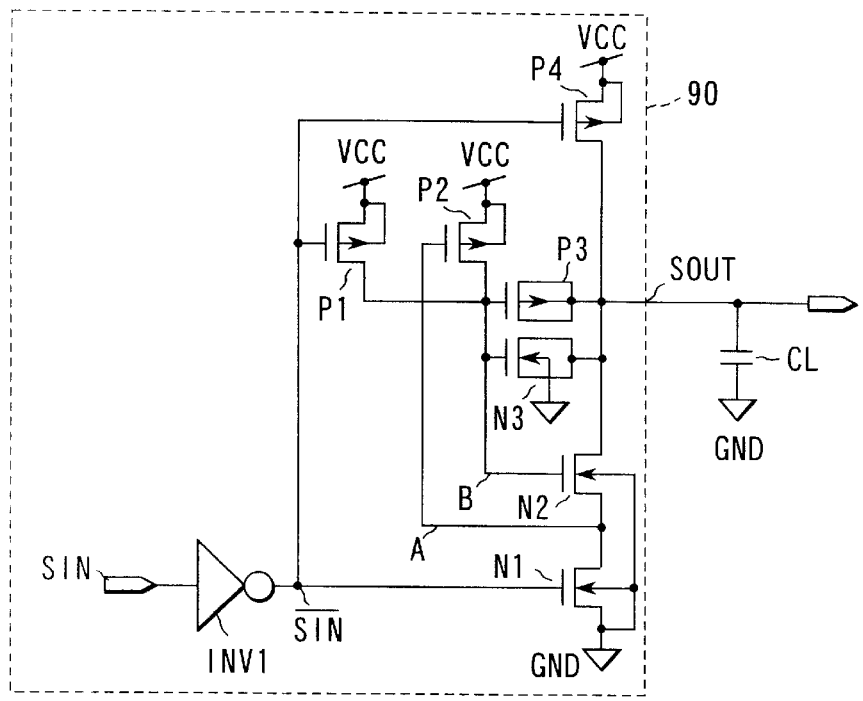
FIG. 15 is circuit diagram showing an output circuit for an LSI according to an eleventh embodiment of the present invention.
Figure 16:
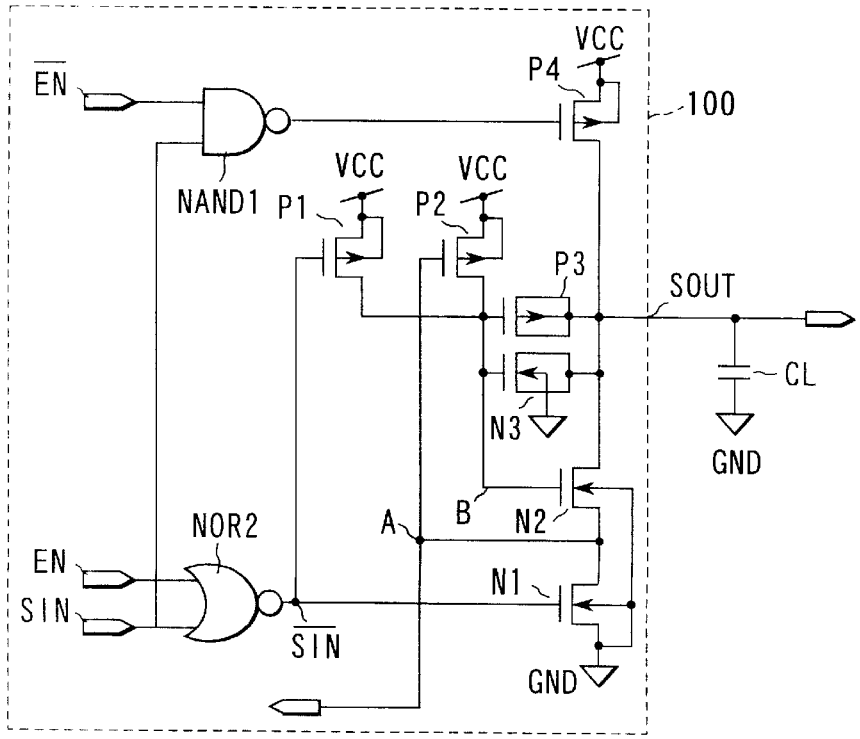
FIG. 16 is circuit diagram showing an output circuit for an LSI according to a twelfth embodiment of the present invention.

FIG. 15 shows an output circuit in an LSI according to an eleventh embodiment of the present invention.

This output circuit 90 is an example of a circuit with VEE=VCC and an example of a bi-state output circuit that enables either the VCC or the GND to be selected as a DC output level.

The output circuit 90 is the same as the above described output circuit 10 in FIG. 3 except that the resistance element RP is omitted, that a PMOS transistor P4 is added between the output node SOUT and the VCC node as the pull-up element, and that the signal from the output node /SIN of the inverter circuit INV1 is supplied to a gate of the PMOS transistor P4. Accordingly, the components of the output circuit 90 are denoted by the same reference numerals as in FIG. 3.

The operation of the output circuit 90 in FIG. 15 is essentially similar to that of the above described output circuit 10 in FIG. 3, but when the NMOS transistor N1 is turned off in response to the signal from the output node /SIN of the inverter circuit INV1, the PMOS transistor P4 is turned on to pull the potential of the output node SOUT up to the VCC.

FIG. 16 shows an I/O circuit in an LSI according to a twelfth embodiment of the present invention.

This I/O circuit 100 is an example of a circuit with VEE=VCC and an example of a tri-state I/O circuit that outputs the VCC or the GND as the DC output level and that can set the I/O node SIO at a high impedance.

Like the above described I/O circuit 80 in FIG. 14, the I/O circuit 100 supplies an input circuit (not shown) with the signal from the node A, the I/O circuit 100 is the same as the I/O circuit 80 except that (1) the resistance element RP has been omitted, that (2) the PMOS transistor P4 is added between the I/O node SIO and the VCC node as the pull-up element, that (3) an NOR circuit NOR2 to which the enable control signal from the control signal input node EN and the signal from the input node SIN are input is provided instead of the inverter INV1 so that the signal from the output node /SIN of the NOR circuit NOR2 is applied to the gates of the NMOS transistor N1 and the PMOS transistor P1, and that (4) a NAND circuit NAND1 to which an inversion enable control signal supplied to a control signal input node /EN and the signal from the input node SIN are input is provided so that its output signal is applied to the gate of the PMOS transistor P4. Accordingly, the components of the output circuit 100 are denoted by the same reference numerals as in FIG. 14.

The operation of the I/O circuit 100 in FIG. 16 is essentially similar to that of the above described I/O circuit 80 in FIG. 14. However, when the enable control signal (the signal from the control signal input node EN) becomes "H", the signal from the output node /SIN of the NOR circuit NOR2 is forced to become the GND to turn off the NMOS transistor N1, while the inversion enable control signal (the signal from the control signal input node /EN) becomes "L" to set the output node of the NAND circuit NAND1 to the VCC to cut off the PMOS transistor P4. As a result, the I/O node SIO has a high impedance.

Alternatively, when the signal from the node SIN becomes "H" while the enable control signal is "L" (the inversion enable control signal is "H"), the output node /SIN of the NOR circuit NOR2 changes to the GND to cut off the NMOS transistor N1, while an output signal from the NAND circuit NAND1 becomes "L" to turn on the PMOS transistor P4 to cause the PMOS transistor P4 to pull up the potential of the I/O node SIO. When the enable control signal is "L" while the signal from the node SIN is "L", the circuits operates in the same manner as the I/O circuit 80 in FIG. 14.

As shown in the eleventh and twelfth embodiments, it goes without saying that the configuration with the PMOS transistor P4 added as the pull-up element instead of the resistance element RP is easily applicable to each of the second to tenth embodiments and their variations and is embraced in the scope of the invention.

In the first to twelfth embodiments and their variations, the element acting as the capacitor, for example, the PMOS transistor P3 and/or the NMOS transistor N3 is connected between the output node SOUT or I/O node SIO and the gate (node B) of the NMOS transistor N2. The present invention, however, is not limited to this, but other connections may be used. Examples are shown in FIGS. 17 and 18.

Figure 17:
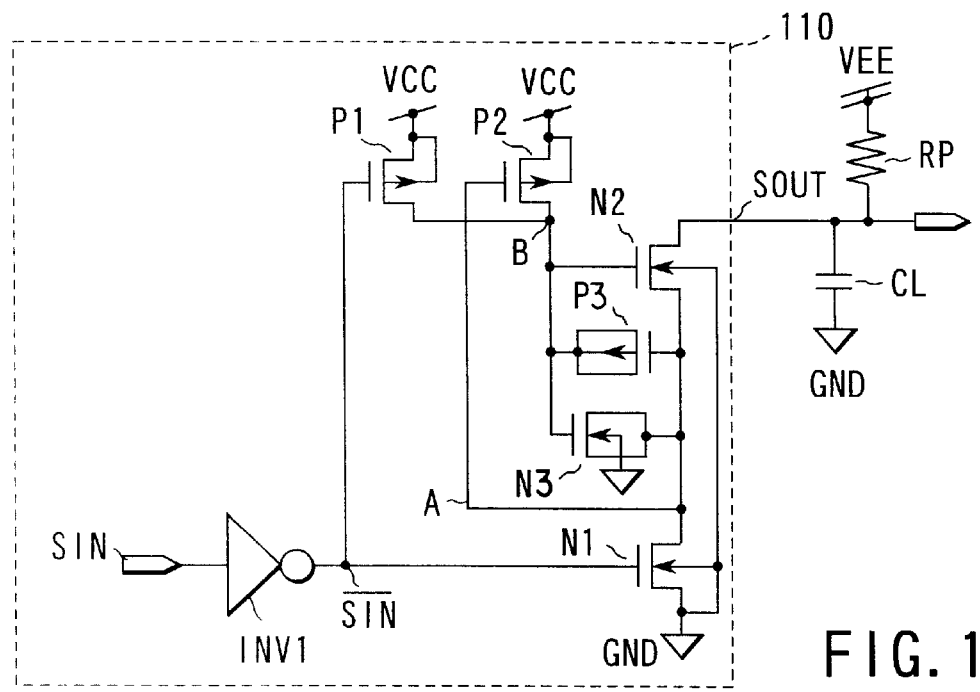
FIG. 17 is circuit diagram showing an output circuit for an LSI according to a thirteenth embodiment of the present invention.
Figure 18:
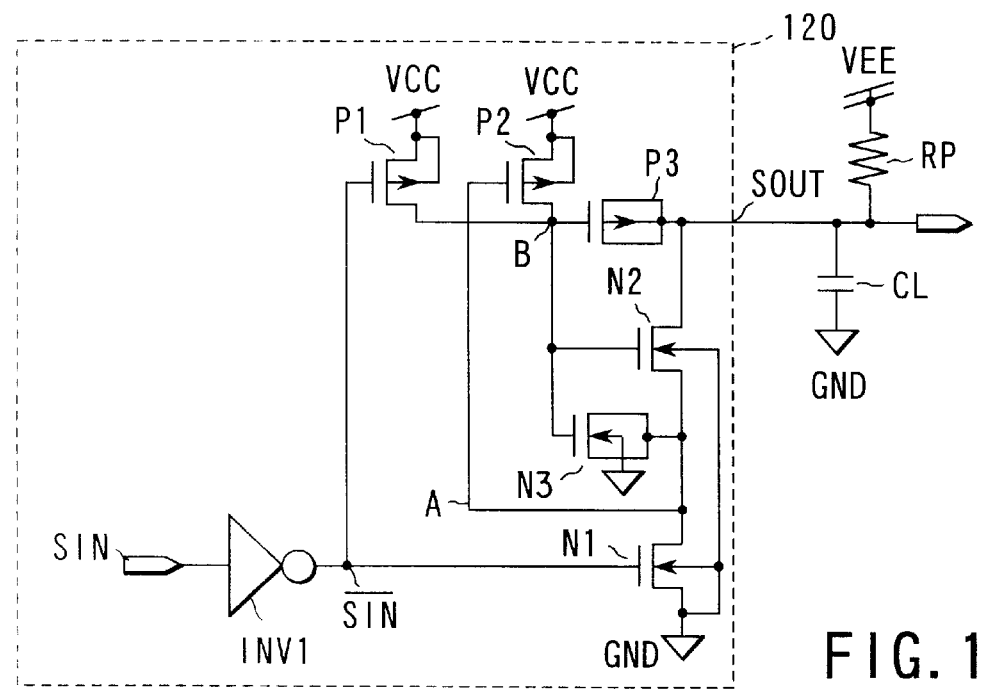
FIG. 18 is circuit diagram showing an output circuit for an LSI according to a fourteenth embodiment of the present invention.

FIG. 17 shows an output circuit in an LSI according to a thirteenth embodiment of the present invention.

This output circuit 110 is the same as the above described output circuit 10 in FIG. 3 except that the PMOS transistor P3 with its drain, source, and back gate connected and the NMOS transistor N3 with its drain and source connected, both transistors acting as the capacitors, are connected between the node A (a common connection point for a source-drain path of the NMOS transistor N1 and a source-drain path of the NMOS transistor N2) and the gate (node B) of the NMOS transistor N2. Accordingly, the components of the output circuit 110 are denoted by the same reference numerals as in FIG. 3.

The NMOS transistor N3 has a gate connected to the node B, a drain and a source connected to the node A, and a back gate connected to the GND. In addition, the PMOS transistor P3 has a gate connected to the node A and a drain, a source, and a back gate connected to the node B.

The operation of the output circuit 110 in FIG. 17 is essentially similar to that of the output circuit 10 in FIG. 3. In this case, the potential of the node B is higher than or equal to that of the node A, so that the above described connections cause a channel to be formed immediately below the gates of the PMOS transistor P3 and the NMOS transistor N3 to act as a capacitor between the nodes A and B. Since a difference in potential between the nodes A and B does not exceed the VCC, no problem occurs with the withstand voltage of the capacitance element.

When the potential of the output node SOUT lowers from the VEE, the PMOS transistor P3 and the NMOS transistor N3, acting as the capacitance elements in response to a rise in the potential of the node A, pulls down the potential of the node B. As a result, a difference in potential between the gate and source of the NMOS transistor N2 decreases to diminish the driving force of the NMOS transistor N2. Consequently, a speed at which the potential of the output node SOUT rises decreases.

In the above described output circuit 10 in FIG. 3, the output node SOUT and the gate of the NMOS transistor N2 are capacitively coupled together, so that the driving force of the NMOS transistor N2 decreases in response a fall in the potential of the output node SOUT.

FIG. 18 shows an output circuit in an LSI according to a fourteenth embodiment of the present invention.

This output circuit 120 is the same as the above described output circuit 10 in FIG. 3 except that the NMOS transistor N3 having its drain, source, and back gate connected and acting as the capacitor is connected between the nodes A and B. Accordingly, the components of the output circuit 120 are denoted by the same reference numerals as in FIG. 3.

The operation of the output circuit 120 in FIG. 18 is essentially similar to that of the output circuit 110 in FIG. 17.

In the above described thirteenth and fourteenth embodiments, effects are obtained by simply using at least one of the transistors P3 and N3 acting as the capacitors.

As shown in the thirteenth and fourteenth embodiments and their variations, the configuration in which the capacitor (the transistor P3 and/or N3) is connected to the position different from that in the output circuit 10 in FIG. 3 according to the first embodiment is of course easily applicable to each of the second to twelfth embodiments and their variations, and is embraced in the scope of the present invention. A basic configuration that is an essential part of the first to twelfth embodiments and their variations is shown in FIG. 19.

Figure 19:
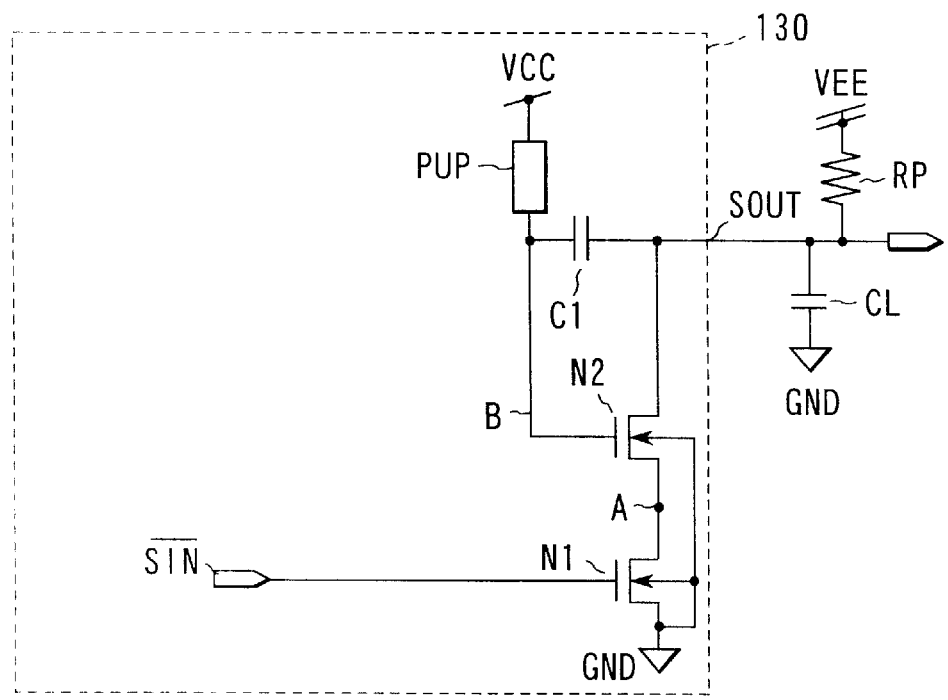
FIG. 19 is a circuit diagram showing a basic configuration of each of the first to twelfth embodiments and their variations.

A CMOS output circuit 130, shown in FIG. 19, includes the first NMOS transistor N1 having one end of the current path between the drain and source thereof connected to the GND node, having the other end connected to the first node A, and having the signal from the input node /SIN input to the gate thereof, the second NMOS transistor N2 having one end of the current path between the drain and source thereof connected to the first node A and having the other end connected to the output node SOUT (or the I/O node SIO), the second node B having the gate of the second NMOS transistor N2 connected thereto, a capacitance element C1 connected between the second node B and the output node SOUT (or the I/O node SIO), and a first pull-up element PUP connected between the second node B and the node of the power potential VCC. A second pull-up element RP is connected between the output node SOUT (or the I/O node SIO) and the node of the power potential VEE to which the power potential VEE higher than the VCC is supplied.

Figure 20:
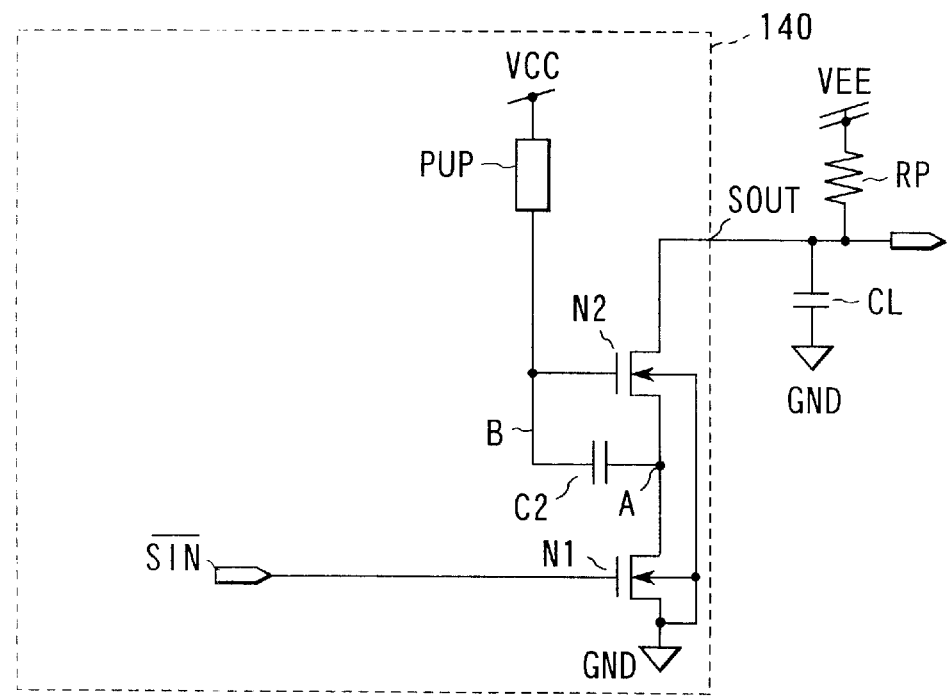
FIG. 20 is a circuit diagram showing a basic configuration of the thirteenth embodiment and its variations.

In addition, a basic configuration that is an essential part of the thirteenth embodiment and its variation is shown in FIG. 20.

A CMOS output circuit 140, shown in FIG. 20, includes the first NMOS transistor N1 having one end of the current path between the drain and source thereof connected to the GND node, having the other end connected to the first node A, and having the signal from the input node /SIN input to the gate thereof, the second NMOS transistor N2 having one end of the current path between the drain and source thereof connected to the first node A and having the other end connected to the output node SOUT (or the I/O node SIO), the second node B having the gate of the second NMOS transistor N2 connected thereto, a capacitance element C2 connected between the first node A and the second node B, and the first pull-up element PUP connected between the second node B and the node of the power potential VCC.

In this case, the second pull-up element RP is also connected between the output node SOUT (or the I/O node SIO) and the node of the power potential VEE to which the power potential VEE higher than the VCC is supplied.

Further, a basic configuration that is an essential part of the fourteenth embodiment and its variation is shown in FIG. 21.

A CMOS output circuit 150, shown in FIG. 21, includes the first NMOS transistor N1 having one end of the current path between the drain and source thereof connected to the GND node, having the other end connected to the first node A, and having the signal from the input node /SIN input to the gate thereof, the second NMOS transistor N2 having one end of the current path between the drain and source thereof connected to the first node A and having the other end connected to the output node SOUT (or the I/O node SIO), the second node B having the gate of the second NMOS transistor N2 connected thereto, a first capacitance element C1 connected between the second node B and the output node SOUT (or the I/O node SIO), a second capacitance element C2 connected between the first node A and the second node B, and the first pull-up element PUP connected between the second node B and the node of the power potential VCC.

In this case, the second pull-up element RP is also connected between the output node SOUT (or the I/O node SIO) and the node of the power potential VEE to which the power potential VEE higher than the VCC is supplied.

As described above, according to the output circuit for a semiconductor integrated circuit in the present invention, no unwanted direct current flows between the output node and the node of the ground potential to avoid deterioration of reliability associated with the withstand voltage of the NMOS transistor connected to the output node, while enabling the rising speed to be controlled.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An output circuit for a semiconductor integrated circuit, comprising:
    a signal output terminal;
    an N-channel first MOS transistor having a current path between a drain and a source thereof, and a gate, one end of the current path being connected to a ground potential node, and the gate being supplied with a first control signal;
    a first node connected to the other end of the current path of the first MOS transistor;
    an N-channel second MOS transistor, having a current path between a drain and a source thereof, and a gate, one end of the current path being connected to the first node and the other end being connected to the signal output terminal;
    a second node connected to the gate of the second MOS transistor connected thereto;
    a capacitance element connected between the second node and the signal output terminal;
    a first power node to which a first power potential is supplied; and
    a first pull-up element connected between the second node and the first power node.

2. The circuit according to claim 1, further comprising:
    a second power node being supplied with a potential higher than the power potential; and
    a second pull-up element connected between the second power node and the signal output terminal.

3. The circuit according to claim 1, wherein the first pull-up element comprises a P-channel first MOS transistor having a current path between a drain and a source thereof and a gate, the current path being connected between the first power node and the second node, the gate being connected to one of the first node, the ground potential node, and the signal output terminal.

4. The circuit according to claim 1, wherein the first pull-up element is a resistance element.

5. The circuit according to claim 4, wherein the resistance element is formed of a P-type diffusion layer provided in an N-type semiconductor substrate connected to the first power node, and a pn junction diode is parasitically formed between the P-type diffusion layer and the N-type semiconductor substrate.

6. The circuit according to claim 1, further comprising a P-channel first MOS transistor having a current path between a drain and a source thereof and a gate, the current path being connected between the first power node and the second node, the gate being supplied with the first control signal.

7. The circuit according to claim 1, further comprising a pn junction diode having an anode and a cathode, the anode being connected to the second node, the cathode being connected to the first power node.

8. The circuit according to claim 1, wherein the capacitance element includes a P-channel first MOS transistor having a drain, a source, a gate, and a back gate, the gate being connected to the second node, the drain, source, and back gate being all connected to the signal output terminal.

9. The circuit according to claim 1, wherein the capacitance element includes an N-channel third MOS transistor having a drain, a source, a gate, and a back gate, the gate being connected to the second node, the drain and source both being connected to the signal output terminal, the back gate being connected to the ground potential node.

10. The circuit according to claim 1, further comprising a P-channel first MOS transistor having a current path between a drain and a source thereof, and a gate, one end of the current path being connected to the signal output terminal, the other end of the current path being connected to the first power node, and the gate being supplied with the first control signal.

11. The circuit according to claim 1, further comprising a P-channel first MOS transistor having a current path between a drain and a source thereof, and a gate, one end of the current path being connected to the signal output terminal, the other end of the current path being connected to the first power node, the gate being supplied with a second control signal.

12. The circuit according to claim 1, further comprising an input circuit connected to the first node to obtain an input signal from the first node to provide it to another circuit.

13. An output circuit for a semiconductor integrated circuit, comprising:
    a signal output terminal;
    an N-channel first MOS transistor having a current path being between a drain and a source thereof, and a gate, one end of the current path being connected to a ground potential node, and the gate being supplied with a first control signal;
    a first node connected to the other end of the current path of the first MOS transistor;
    an N-channel second MOS transistor having a current path between a drain and a source thereof, and a gate, one end of the current path being connected to the first node and the other end being connected to the signal output terminal;
    a second node connected to the gate of the second MOS transistor;
    a capacitance element connected between the first node and the second node;
    a first power node to which a first power potential is supplied; and
    a first pull-up element connected between the second node and the first power node.

14. The circuit according to claim 13, further comprising:
    a second power node being supplied with a potential higher than the power potential; and
    a second pull-up element connected between the second power node and the signal output terminal.

15. The circuit according to claim 13, wherein the first pull-up element comprises a P-channel first MOS transistor having a current path between a drain and a source thereof and a gate, the current path being connected between the first power node and the second node, the gate being connected to one of the first node, the ground potential node, and the signal output terminal.

16. The circuit according to claim 13, wherein the first pull-up element is a resistance element.

17. The circuit according to claim 16, wherein the resistance element is formed of a P-type diffusion layer provided in an N-type semiconductor substrate connected to the first power node, and a pn junction diode is parasitically formed between the P-type diffusion layer and the N-type semiconductor substrate.

18. The circuit according to claim 13, further comprising a P-channel first MOS transistor having a current path between a drain and a source thereof and a gate, the current path being connected between the first power node and the second node, the gate being supplied with the first control signal.

19. The circuit according to claim 13, further comprising a pn junction diode having an anode and a cathode, the anode being connected to the second node, the cathode being connected to the first power node.

20. The circuit according to claim 13, wherein the capacitance element includes a P-channel first MOS transistor having a drain, a source, a gate, and a back gate, the gate being connected to the first node, the drain, source, and back gate being all connected to the second node.

21. The circuit according to claim 14, wherein the capacitance element includes an N-channel third MOS transistor having a drain, a source, a gate, and a back gate, the gate being connected to the second node, the drain and source both being connected to the first node, the back gate being connected to the ground potential node.

22. The circuit according to claim 13, further comprising a P-channel first MOS transistor having a current path between a drain and a source thereof, and a gate, one end of the current path being connected to the signal output terminal, the other end of the current path being connected to the first power node, and the gate being supplied with the first control signal.

23. The circuit according to claim 13, further comprising a P-channel first MOS transistor having a current path between a drain and a source thereof, and a gate, one end of the current path being connected to the signal output terminal, the other end of the current path being connected to the first power node, and the gate being supplied with a second control signal.

24. The circuit according to claim 13, further comprising an input circuit connected to the first node to obtain an input signal from the first node to provide it to another circuit.

* * * * *